APPARATUS AND METHOD OF ASSEMBLING COMPONENTS ON A PRINTED CIRCUIT BOARD

Filed Jan. 28, 1970 4 Sheets-Sheet 1

INVENTORS
DALE E. FRELS
RICHARD A. DeLILLE
ROBERT W. SAMUELSON
JAMES R. LINDSAY
BY
Meyer, Tilberry & Body
ATTORNEYS INVENTORS
DALE E. FRELS
RICHARD A. DeLILLE
ROBERT W. SAMUELSON
JAMES R. LINDSAY
BY
Meyer, Tilberry & Body
ATTORNEYS INVENTORS
DALE E. FRELS
RICHARD A. DeLILLE
BY ROBERT W. SAMUELSON
JAMES R. LINDSAY
Meyer, Tilberry & Body
ATTORNEYS INVENTORS
DALE E. FRELS
RICHARD A. DeLILLE
BY ROBERT W. SAMUELSON
JAMES R. LINDSAY
Meyer, Tilberry & Body
ATTORNEYS United States Patent Office 3,611,544

Patented Oct. 12, 1971

3,611,544
APPARATUS AND METHOD OF ASSEMBLING COMPONENTS ON A PRINTED CIRCUIT BOARD

Dale E. Frels, Barstow, and Richard A. De Lille and Robert W. Samuelson, Moline, Ill., and James R. Lindsay, Bettendorf, Iowa, assignors to Gulf + Western Industries, Inc., New York, N.Y.

Filed Jan. 28, 1970, Ser. No. 6,533
Int. Cl. B23q *17/00;* H05k *13/04, 3/30*
U.S. Cl. 29—407 11 Claims

ABSTRACT OF THE DISCLOSURE

This invention relates to an apparatus and method of assembling electrical components having leads in selected openings on a printed circuit board. The apparatus comprises a housing including a read-out panel, a plurality of light sources disposed within the housing, means for selectively energizing each of the light sources and means for transmitting the light emitted by the light sources to preselected positions on the read-out panel. The method comprises the steps of providing a read-out panel having a plurality of selectively illuminable light emitting sources releasably secured thereto at preselected locations, each of the locations defining the relative position of a corresponding electrical component; positioning the printed circuit board on the read-out panel with some of the openings in alignment with some of the light emitting sources; selectively illuminating the light emitting sources; and inserting the leads of the corresponding electrical component in the respective openings of the printed circuit board as indicated by said light emitting sources.

This invention pertains to the component assembly art and more particularly to a system for locating common multiple components in assembly operations.

The invention is particularly applicable to an apparatus and method of assembling electrical components on a printed circuit board and will be described with specific reference thereto; however, it is to be appreciated that the invention has broader applications and may be used in a wide variety of assembling operations.

In the manufacture of electronic equipment, present day designs require miniaturization of the equipment in order to minimize volume and weight and provide ease of replacement. In this respect, much use is presently being made of printed circuit boards, and often a complete major component, such as an amplifier or power supply, is mounted on a single printed circuit board. This, of course, requires the attaching of a large number of electrical components, such as resistors, capacitors, rectifiers, diodes and the like, on a single board. Each component has a specific location on the printed circuit board which is determined by the design and function of the circuit.

The assembly of printed circuit boards is an arduous task. Present methods of assembling the components on a circuit board are slow and require skilled labor, in that the location of the position in which each individual component is to be mounted on the board must be found and identified and then the proper component installed in that position. These steps are repeated for each component until all of the required components are positioned on the circuit board ready for soldering. The entire process is not only slow, but requires personnel having at least some knowledge of the circuitry of the board, in order to properly locate and position the correct components thereon. An extensive training period involving great expense is required until the assembler has mastered the foregoing skills.

Most assembly operations have heretofore been carried out with the aid of drawings; that is, the assembler is provided with a blueprint showing the assembled positions of the various components. This method is both time consuming and mentally fatiguing, because it requires that the assembler continually change his field of view from the drawing to the parts container and then to the assembly board itself. Furthermore, when large number of parts are to be assembled, errors are often made as the components may be installed in the wrong location or completely overlooked. Consequently, much time is spent in trouble-shooting the finished assembled unit.

Various attempts have been made by prior art devices to eliminate the foregoing problems, however, none have been completely successful. Thus, for example, U.S. Pat. 3,372,455 to Howie, issued Mar. 12, 1968 discloses an apparatus for facilitating the insertion of electrical components on a printed circuit board. The apparatus comprises a box having a single light source and an upper portion with openings for registration with the openings in the circuit board into which electrical components are to be inserted. Several templates are provided corresponding in number to the number of different types of multiple components to be inserted. Insertion of the template between the light source and the openings in the light box and positioning the printed circuit board over the openings in the light box in registration therewith will result in light only being permitted to shine through certain openings in the circuit board. A component corresponding to the template is then installed in the illuminated openings. The first template is then removed and a second template for another component is inserted. This process must be repeated for each component employed in the particular circuit.

It can readily be seen that this device has numerous disadvantages. Firstly, it is necessary to have a large number of templates on hand, thereby increasing the cost and bulkiness of the equipment. Secondly, field of view changes are still prevalent, since the assembler must select a component and then sort through several templates until the corresponding template is selected. Lastly, due to the multiplicity of operations involved, namely the continual inserting and removal of templates, the overall assembly time becomes excessive.

The present invention contemplates a new and improved apparatus and method of assembling electrical components on a printed circuit board which overcomes all of the above referred problems and others, and provides an assembly system which is rapid, accurate and relatively inexpensive.

In accordance with the present invention, there is provided apparatus for assembling electrical components in selected openings on a printed circuit board comprising: a housing including a read-out panel; a plurality of light sources disposed within the housing; means for selectively energizing each of the light sources; and means for transmitting the light emitted by the light sources to preselected positions on the read-out panel.

In accordance with a more limited aspect of the invention, there is provided an electrical components container operatively associated with the selective energizing means, the container having a plurality of component bins, each of the bins being adapted to retain a specific type of electrical component.

Further in accordance with the invention, there is provided the method of assembling electrical components having leads in selected openings on a printed circuit board comprising the steps of: providing a read-out panel having a plurality of selectively illuminable light emitting sources releasably secured thereto at preselected locations, each of the locations defining a relative position of a corresponding electrical component; positioning the printed circuit board on the read-out panel with some of the openings in alignment with some of the light emitting sources; selectively illuminating the light emitting sources; and inserting the leads of the corresponding electrical component in the respective openings of the printed circuit board as indicated by said light emitting sources.

The principal object of the present invention is to provide an improved apparatus and method of assembling electrical components in selected openings on a printed circuit board.

Another object of the present invention is to provide an improved apparatus and method of assembling electrical components on a printed circuit board which reduces to a minimum the possibility of assembly error.

An additional object of the present invention is to provide an improved apparatus and method of assembling electrical components on a printed circuit board which greatly reduces assembly time, thereby minimizing the cost of operation.

A further object of the present invention is to provide an improved apparatus and method of assembling electrical components on a printed circuit board which permits an inexperienced individual to become a skilled operator in a relatively short period of time, thereby eliminating the necessity of a long training program.

A still further object of the present invention is to provide an improved apparatus and method of assembling electrical components on a printed circuit board which minimizes operator fatigue and thereby increases the overall efficiency of the assembly operation.

Yet another object of the present invention is to provide an improved apparatus and method of assembling electrical components on a printed circuit board wherein the exhaustion of the supply of a specific component may be readily ascertained.

A further object of the present invention is to provide an improved apparatus for assembling electrical components on a printed circuit board which may be rapidly and economically manufactured.

These and other objects and advantages will become apparent from the following description used to illustrate the preferred embodiment of the invention when read in connection with the accompanying drawings in which.

Figure 1:
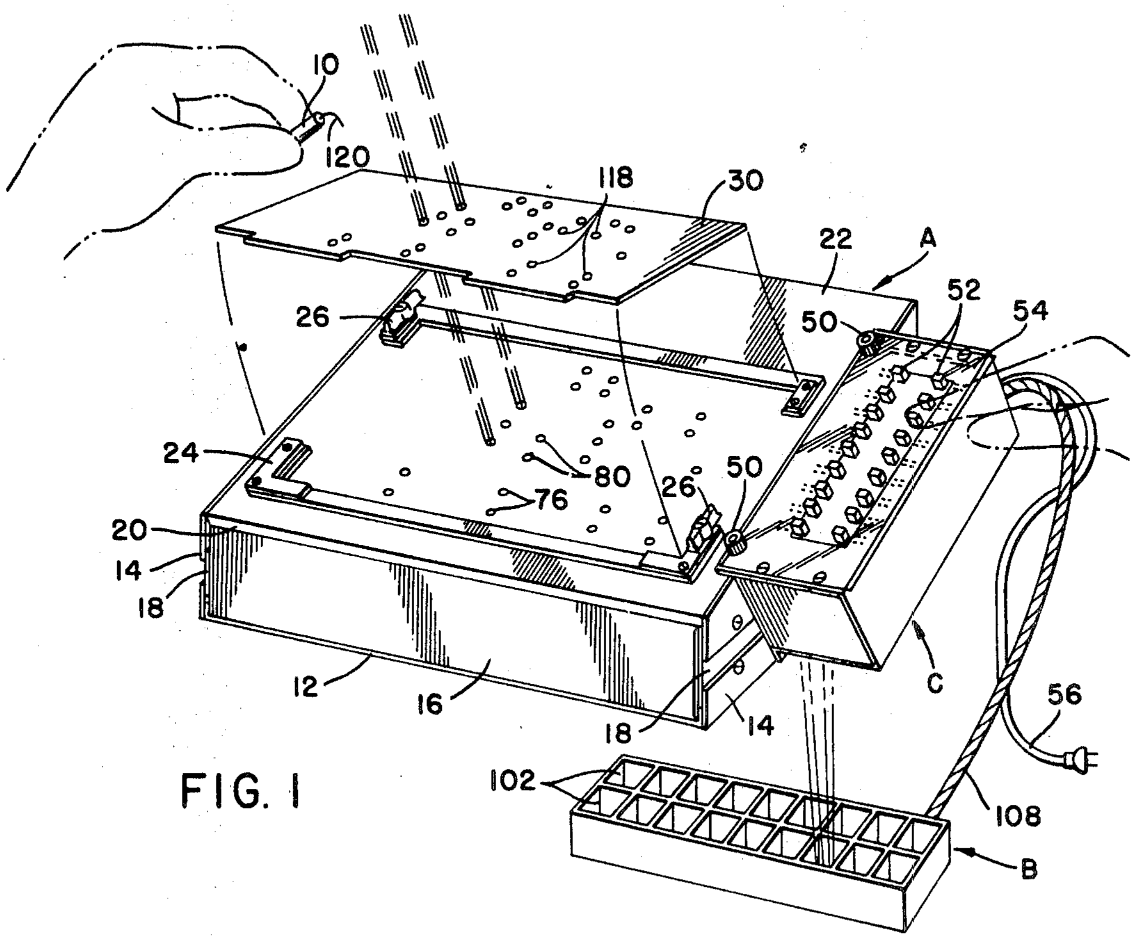
FIG. 1 is a perspective view of an apparatus for assembling components on a printed circuit board constructed in accordance with the present invention.

Referring now to the drawings wherein the showings are for the purpose of illustrating a preferred embodiment of the present invention only and not for the purpose of limiting same, FIG. 1 shows an apparatus for assembling electrical components, designated generally by the reference letter A, which has been constructed in accordance with the present invention. The assembling apparatus A includes an electrical components container, designated generally by the reference letter B, for organizing and retaining a plurality of electrical components, such as electrical component 10, to facilitate and expedite the assembling operation.

Figure 3:
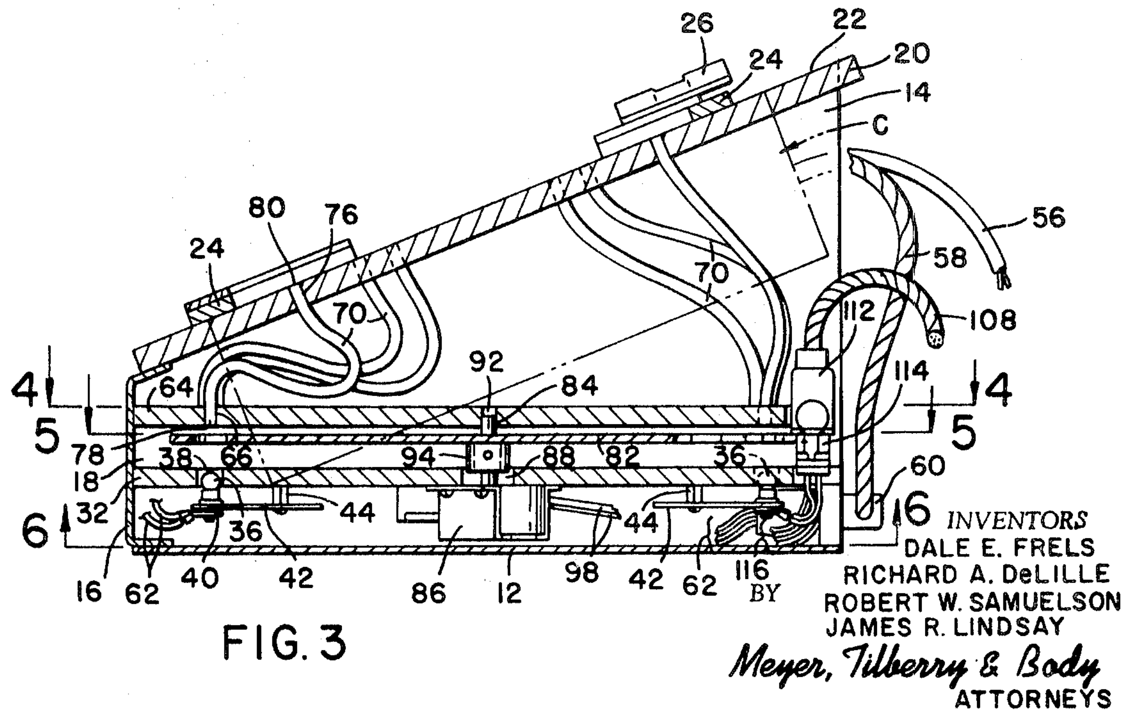
FIG. 3 is a cross-sectional view taken along line 3—3 of FIG. 2.
Figure 2:
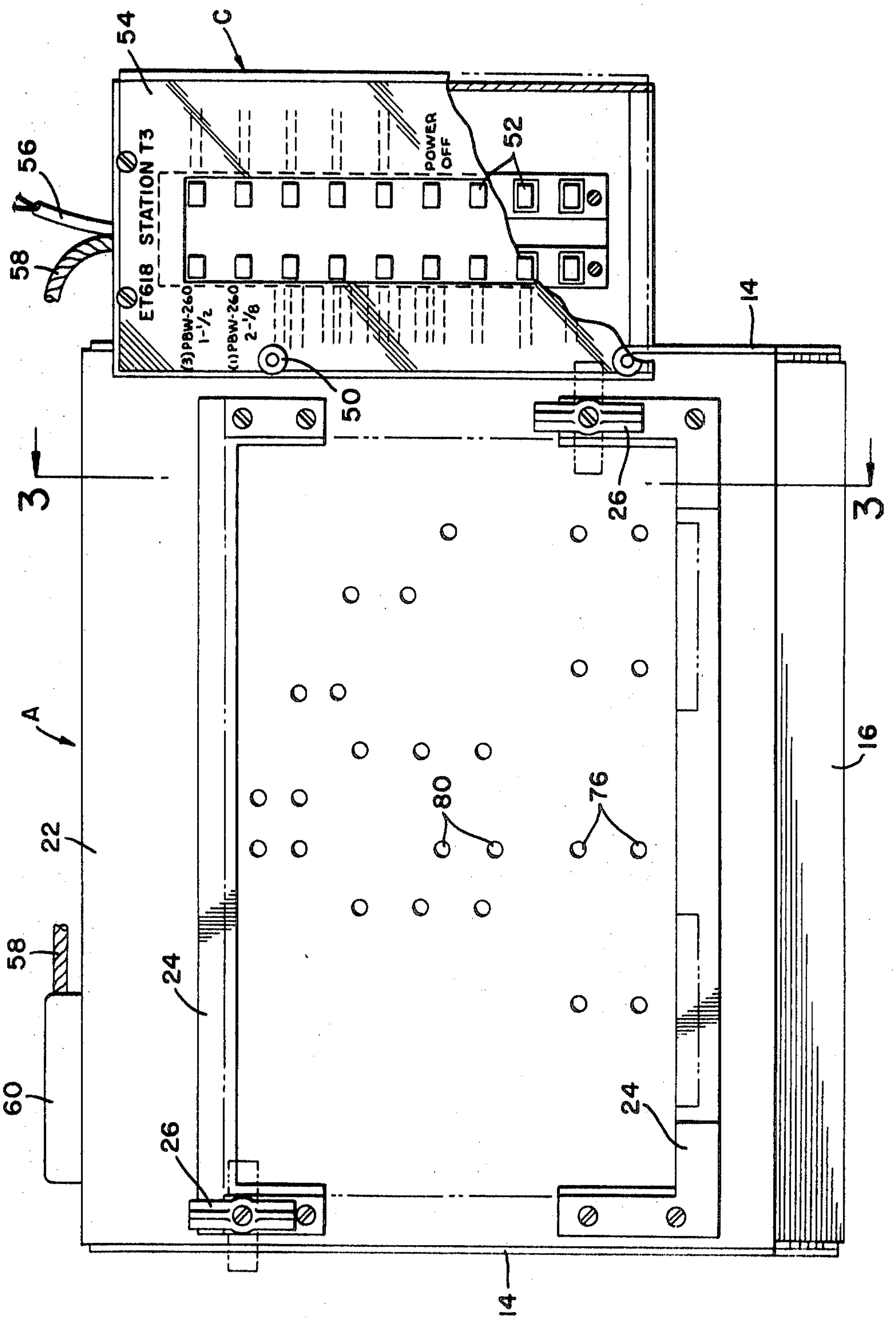
FIG. 2 is a plan view of the apparatus shown in FIG. 1.

Reference is now made to FIGS. 1–3, wherein the assembling apparatus A is shown as comprising a housing having a bottom wall 12, a pair of opposed side walls 14 and a front wall 16. There is further provided a pair of side reinforcing bars 18 which strengthen the overall structural rigidity of the housing.

In accordance with the present invention there is provided a read-out panel 20 which is disposed intermediate the side walls 14 and slopes downwardly toward the front wall 16. The read-out panel 20 includes an exterior surface 22 to which has been secured a mounting frame 24 having retaining clips 26 pivotally attached thereon. The mounting frame 24 is configured to receive and align on the exterior surface 22 of the read-out panel 20 a printed circuit board, such as board 30 shown in FIG. 1, upon which a plurality of electrical components, such as component 10, are to be assembled. The retaining clips 26 may be pivoted from a normal position to a locking position, as shown in dashed lines in FIG. 2, in order to releasably secure the printed circuit board 30 to the read-out panel 20. It is to be appreciated that the shape of the mounting frame 24 can easily be altered to accommodate printed circuit boards of any configuration. As such, the assembling apparatus A is limitless in its ability to cope with any assembling operation.

Figure 6:
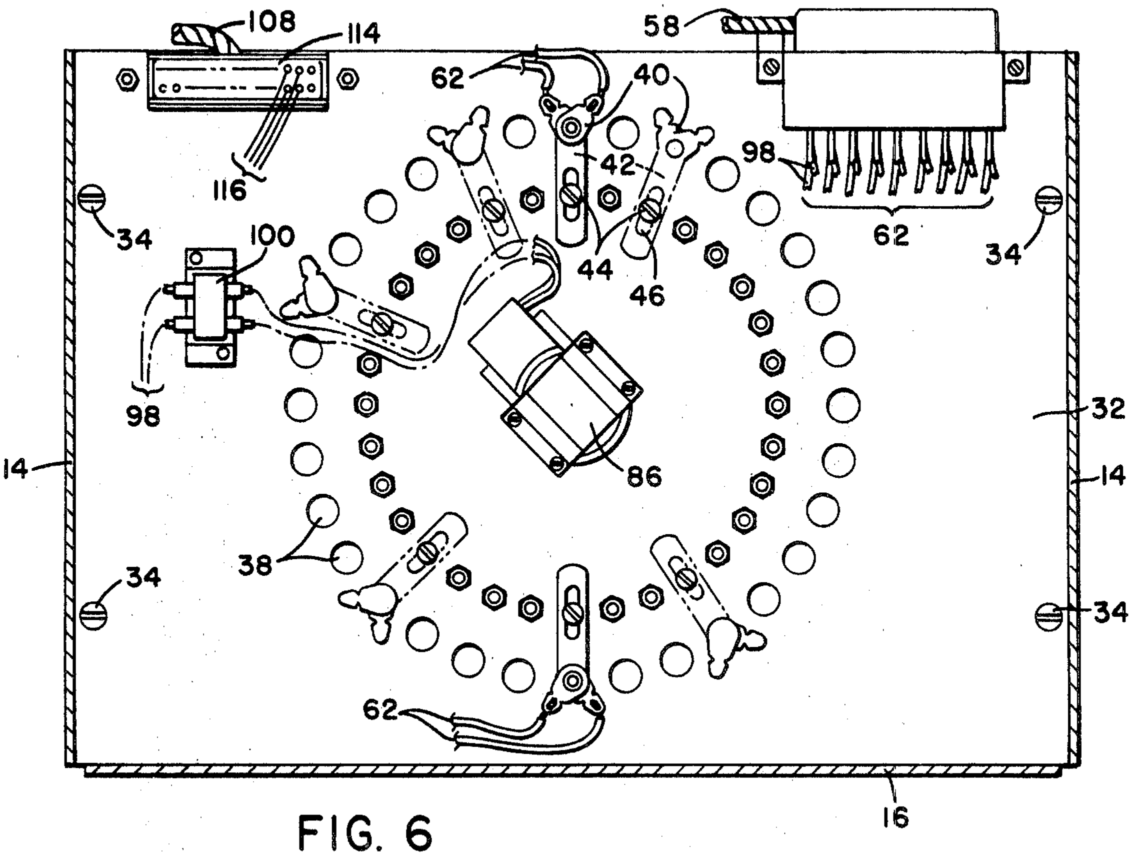
FIG. 6 is a cross-sectional view taken along line 6—6 of FIG. 3.

Disposed within the housing is a first mounting member 32 which extends substantially parallel to the bottom wall 12. The member 32 is secured to the underside of the reinforcing bars 18 by means of screws 34. In accordance with the present invention there is provided a plurality of light sources, illustrated as bulbs 36, which extend upward through openings 38 in the member 32. As shown in FIGS. 3 and 6, the bulbs 36 are releasably retained in sockets 40 which are secured to the underside of the member 32 by means of brackets 42 and spacer bolts 44 which maintain the bracket at a preselected distance below the first mounting member. The bracket 42 includes an elongated slot 46 which permits the bracket to be adjusted in order to assure that the bulb 36 is centrally located within the opening 38. For purposes of clarity only a few of the sockets 40 and brackets 42 have been illustrated in FIG. 6; it is to be appreciated that the number of light sources will vary depending upon the number of electrical components to be installed on the printed circuit board.

In accordance with the present invention there is provided means for selectively energizing each of the light sources which may take a variety of forms; however, in accordance with the preferred embodiment it takes the form of a controller designated generally by the reference letter C, which is secured to the assembling apparatus A by bolts 50. The controller C comprises a plurality of switches having actuator buttons 52 and contacts (not illustrated) which are controlled by said buttons. Each switch and its associated actuator button 52 represents a specific electrical component which is to be installed on the printed circuit board 30. As best shown in FIG. 2, a component identification card 54 is disposed on the upper surface of the controller C adjacent the actuator buttons 52. The card 54 indicates the number and specific component which corresponds to each actuator button 52. The switches and their respective actuator buttons 52 are connected to an external power source by a power supply cord 56.

Each of the switches in the controller C is connected by leads, which combine to form a control cable 58, to a multi-connector plug 60 located at the back of the assembly apparatus A intermediate the bottom wall 12 and the first mounting member 32. Each of the sockets 40 is connected by leads 62 to the connector plug 60, whereby when one of the actuator buttons 52 is depressed at least one of the bulbs 36 will be energized.

Figures 4, 5:
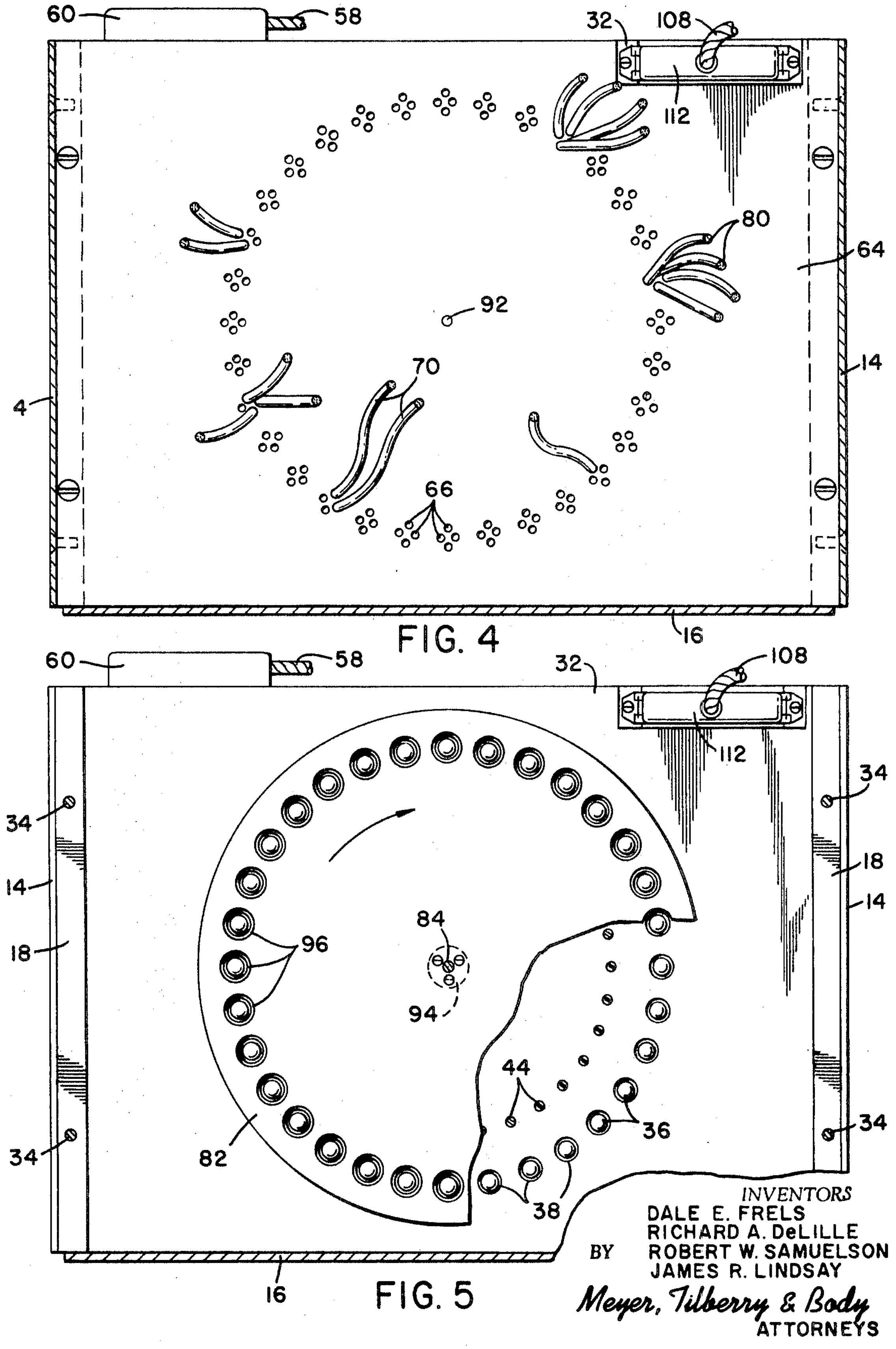
FIG. 4 is a cross-sectional view taken along line 4—4 of FIG. 3.
FIG. 5 is a cross-sectional view taken along line 5—5 of FIG. 3.

As shown in FIGS. 3 and 4, there is disposed within the housing a second mounting member 64 which is maintained in spaced-apart relationship and parallel to the first mounting member 32. The second member 64 includes a plurality of openings 66 which are in general alignment with the openings 38 in the first member 32.

Figure 7:
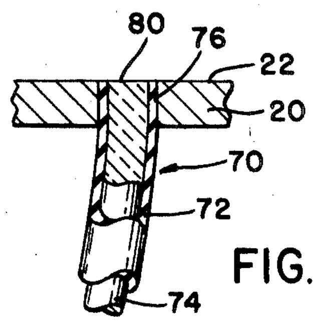
FIG. 7 is an enlarged cross-sectional view of a fiber optic.

In accordance with the present invention there is provided means for transmitting the light emitted by the light sources, as represented by bulbs 36, to preselected positions on the read-out panel 20 which may take a variety of forms; however, in accordance with the preferred embodiment of the present invention, it takes the form of fiber optics, designated generally by the reference numeral 70. As shown in FIG. 7 the fiber optic 70 includes an outer casing 72 and an internal light transmitting media 74. The read-out panel 20 includes a plurality of openings 76 in preselected locations. Each fiber optic 70 includes a lower end 78 which is inserted in opening 66 and an upper end 80 which is inserted in opening 76. In this manner, when a bulb 36 is sequentially energized the light emitted therefrom will be transmitted through those fiber optics 70 which are in operative association with the particular bulb which is illuminated. Depending upon the number of fiber optics 70 operatively associated with a given bulb 36, either one or more of the openings 76 in the read-out panel 20 will appear illuminated. As shown in FIG. 4, the number of fiber optics 70 which are associated with a given bulb 36 will vary depending upon the number and type of electrical component to be installed to which the bulb corresponds.

In accordance with the present invention there is provided means for causing the transmitted light reaching the read-out panel 20 to define a flashing condition which may take a variety of forms; however, in accordance with the preferred embodiment of the present invention it takes the form of a rotating disc 82 which interrupts the light emitted by bulbs 36 prior to it reaching the lower ends 78 of the fiber optics 70. The disc 82 is disposed intermediate the first mounting member 32 and the second mounting member 64 and is secured to a shaft 84 for rotation therewith. The shaft 84 is driven by a motor 86 which is secured to the underside of the first member 32. The shaft 84 extends upwardly from the motor 86 through an opening 88 in the first member 32 and is supported at its upper end in an opening 92 in the second member 64. The disc 82 is maintained at a preselected location on the shaft 84 by a central support 94. The disc 82 includes a plurality of openings 96 which are in alignment with bulbs 36, whereby when the disc rotates the light being received by the lower ends 78 of the fiber optics 70 is periodically interrupted to define a flashing condition at the read-out panel 20. The motor 86 is connected by leads 98 through connector block 100 to the connector plug 60, whereby when any of the bulbs 36 are energized as a result of depressing actuator buttons 52 the motor will also be energized.

Figure 8:
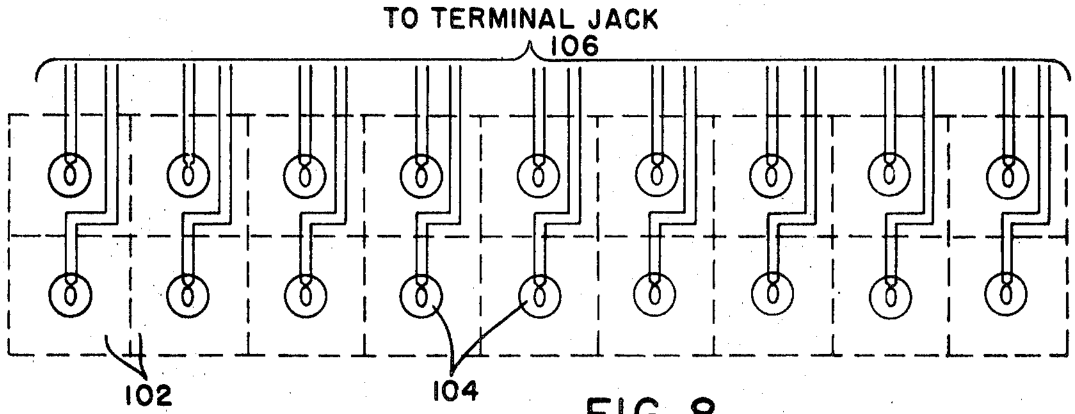
FIG. 8 is a schematic view of the parts container circuitry.

As best shown in FIGS. 1 and 8, the electrical components container B comprises a plurality of component bins 102, each of said bins being adapted to retain a specific type of electrical component, such as component 10. As shown schematically in FIG. 8, each bin 102 contains a light source 104 having leads 106. All of the leads combine to form a wiring harness 108. Secured at the rear of the first mounting member 32 is a terminal jack plug having an upper male portion 112 and a lower female portion 114. The wiring harness 108 is connected to the male portion 112, thereby facilitating its disconnection from the assembling apparatus A when not in use. The lower female portion 114 is connected to a plurality of leads 116 which are interconnected to the sockets 40. In this manner, when an actuator button 52 is depressed, not only will the corresponding bulb 36 be energized, but the corresponding light source 104 in the component container B will also be energized, thereby visually indicating the identity of the electrical component to be installed as well as its location on the printed circuit board.

The operation of the subject invention will now be described in greater detail with reference to FIGS. 1–8. For purposes of this explanation, it will be assumed that a printed circuit board, such as board 30 having openings 118 therein is to have a variety of electrical components, such as resistors, capacitors, rectifiers, diodes and the like, installed thereon. These components are retained in bins 102 of the electrical component container B.

The printed circuit board 30 is placed on the read-out panel 20 and retained thereon and maintained in proper alignment therewith by the mounting frame 24. The retaining clips 26 are pivoted to the position shown in dashed lines in FIG. 2 in order to assure that the circuit board 30 does not shift during the assembling operation. The operator now proceeds to assemble the printed circuit board 30 by inserting the leads, as represented by lead 120 of component 10 in the various openings 118.

When the circuit board 30 is located on the read-out panel 20, the location of the openings 118 in the board will vary with respect to the upper ends 80 of the fiber optics 70 depending upon certain factors. In some instances, the upper end 80 will be located intermediate a pair of openings 118, in which case the installer will place the leads 120 of the respective component in the two openings having the upper end therebetween. In other instances, an upper end 80 will appear under each of the two openings 118 into which the leads 120 are to be inserted. This type of arrangement is used in board areas where the circuitry is particularly dense in order to avoid the possibility of error. Lastly, in those instances where the component is polarized, one upper end 80 will be located intermediate the two openings 118 into which the leads 120 are to be inserted and a second upper end 80 will appear under one of the openings. The opening 118 under which the upper end 80 appears indicates the location of the plus end of the component lead.

To commence the assembly operation, the installer connects the power supply cord 56 to an external power source and depresses one of the actuator buttons 52. This will cause a light source 104 in one of the component bins 102 to be energized, thereby generating a beam of light upward (as shown in FIG. 1) which can easily be seen by the installer. Simultaneously, at least one flashing light will appear on the read-out panel 20 beneath the circuit board 30 which indicates the correct location of the component to be installed. The installer need only remove the particular component, such as component 10, from the illuminated bin 102 and place its leads 120 in the appropriate openings 118 as indicated by the flashing light. If more than one component of a particular type is to be installed on the board this information will be contained on the component identification card 54 adjacent the respective actuator button 52. As such, the installer cannot inadvertently forget to install the correct number of components on the board. Although the foregoing description has referred to a single flashing light on the read-out panel 20, it is to be appreciated that if more than one particular type of component is involved, or if the circuitry is particularly dense or a polarized component is involved, then there will be a plurality of flashing lights as heretofore described.

The foregoing procedure is repeatedly carried out for each type of component to be installed, as reflected by the component identification card 54. Thus, the installer will selectively depress actuator buttons 52 until all of the different components listed on the component identification card 54 have been installed on the circuit board 30.

The subject invention may easily be programmed for variously configured circuit boards by simply changing the location of the upper ends 80 of the fiber optics 70 on the read-out panel 20 and preparing a new component identification card 54. Additionally, the configuration of the mounting frame 24 may have to be altered in order to accommodate the new circuit board. As such, the subject invention is quite versatile and can be readily adapted for use with all printed circuit boards.

Although the invention has been described with reference to specific embodiments, variations within the scope of the following claims will be apparent to those skilled in the art.

Having thus described our invention, we claim:

1. Apparatus for assembling electrical components in selected openings on a printed circuit board comprising: a housing including a read-out panel; a plurality of light sources disposed within said housing; means for selectively energizing each of said light sources; and means for transmitting the light emitted by said light sources to preselected positions on said read-out panel.

2. The apparatus defined in claim 1, wherein said light transmitting means comprises a plurality of fiber optics.

3. The apparatus defined in claim 2, wherein said fiber optics have first and second end portions, each of said first end portions being in operative association with a light source and each of said second end portions being releasably secured to said read-out panel at preselected locations.

4. The apparatus defined in claim 3, wherein said read-out panel includes an exterior surface adapted to releasably retain said printed circuit board and a plurality of openings extending from said surface through said panel, some of said openings corresponding in location to the opening in said printed circuit board, said second end portions being releasably secured within said panel openings, whereby when said light sources are selectively energized openings in said printed circuit board will be sequentially illuminated.

5. The apparatus defined in claim 1, wherein said selective energizing means comprises a controller having a plurality of contacts, each said contacts being connected to at least one of said light sources.

6. The apparatus defined in claim 5, wherein said controller further includes a plurality of switches, each of said switches representing an electrical component to be installed on said printed circuit board and in operative engagement with a respective contact, whereby when one of said switches is actuated at least one of said light sources is energized.

7. The apparatus defined in claim 1, further including means for causing the transmitted light reaching said read-out panel to define a flashing condition.

8. The apparatus defined in claim 7, wherein said flashing means comprises a rotating, perforated disc disposed intermediate said light sources and said transmitting means and a motor in driving engagement with said disc, whereby when said motor rotates said disc the light emitted by said light sources is periodically prevented from being transmitted to said read-out panel so as to define a flashing condition.

9. The apparatus defined in claim 1, further including an electrical components container operatively associated with said energizing means, said container having a plurality of component bins, each of said bins being adapted to retain a specific type of electrical component.

10. The apparatus defined in claim 9, wherein each of said bins includes a light source, said bin light sources being in electrical connection wtih said housing light sources which correspond to said electrical component in each of said bins, whereby when a housing light source is energized a corresponding bin light source will be illuminated.

11. The method of assembling electrical components having leads in selected openings on a printed circuit board comprising the steps of:

(a) providing a read-out panel having a plurality of selectively illuminable light emitting sources releasably secured thereto at preselected locations, each of said locations defining the relative position of a corresponding electrical component;

(b) positioning said printed circuit board on said read-out panel with some of said openings in alignment with some of said light emitting sources;

(c) selectively illuminating said light emitting sources and (d) inserting the leads of said corresponding electrical component in the respective openings of said printed circuit board as indicated by said light emitting sources.

References Cited

UNITED STATES PATENTS

| | | | |
|---|---|---|---|
| 2,959,848 | 11/1960 | Savitt | 29—407 |
| 3,216,101 | 11/1965 | Miller | 29—626 X |
| 3,372,455 | 3/1968 | Howie | 29—203 B |

THOMAS H. EAGER, Primary Examiner

U.S. Cl. X.R.

29—203 B, 203 P, 626